(12) United States Patent
Goumballa et al.

(10) Patent No.: US 11,796,635 B2
(45) Date of Patent: Oct. 24, 2023

(54) RADAR TRANSCEIVER

(71) Applicant: NXP USA, INC., Austin, TX (US)

(72) Inventors: Birama Goumballa, Larra (FR); Gilles Montoriol, Fonsorbes (FR); Cristian Pavao Moreira, Frouzins (FR); Dominique Delbecq, Fonsorbes (FR)

(73) Assignee: NXP USA, INC., Austin, TX (US)

( * ) Notice: Subject to any disclaimer, the term of this patent is extended or adjusted under 35 U.S.C. 154(b) by 255 days.

(21) Appl. No.: 17/391,278

(22) Filed: Aug. 2, 2021

(65) Prior Publication Data

US 2022/0050174 A1    Feb. 17, 2022

(30) Foreign Application Priority Data

Aug. 14, 2020 (EP) ..................... 20305932

(51) Int. Cl.
| | | |
|---|---|---|
| *G01S 7/40* | (2006.01) | |
| *G01S 13/26* | (2006.01) | |
| *H03H 11/16* | (2006.01) | |

(52) U.S. Cl.
CPC .......... *G01S 7/4008* (2013.01); *G01S 7/4021* (2013.01); *G01S 13/26* (2013.01); *H03H 11/16* (2013.01)

(58) Field of Classification Search
CPC .......... G01S 13/26; G01S 7/35; G01S 7/4008; G01S 7/4021; H03H 11/16; H03M 1/1033; H03M 1/66
See application file for complete search history.

(56) References Cited

U.S. PATENT DOCUMENTS

| | | | |
|---|---|---|---|
| 4,077,038 A | * | 2/1978 | Heller ................. G01S 13/5242 342/159 |
| 6,177,894 B1 | | 1/2001 | Yamaguchi |
| 6,833,801 B1 | | 12/2004 | Ostrem et al. |
| 7,009,538 B1 | | 3/2006 | Ferguson |

(Continued)

*Primary Examiner* — Timothy X Pham

(57) ABSTRACT

The disclosure relates to a radar transceiver having a transmitter comprising a phase shifter. Example embodiments include a radar transceiver (200) having a normal mode of transmitter operation and a self-test mode of operation, the transceiver (200) comprising: a digital controller (116) configured to provide a digital control signal indicative of a phase shift; a digital to analogue converter (122) configured to receive the digital control signal and provide an analogue signal in accordance with the phase shift; a phase shifter (124) configured to receive the analogue signal and provide a phase shifted output signal for transmission; a dummy load (240) connected to receive the analogue signal from the digital to analogue converter (122) and to provide an analogue output; a resistor network (331) connected across an output of the dummy load (240); a testing module (335) configured to measure the analogue output of the dummy load (240); and a controller module (339) configured to control operation of the dummy load (240), testing module (335) and digital controller (116) during the self-test mode of operation by: enabling the dummy load (240); operating the digital controller (116) to provide a range of digital control signals to the digital to analogue converter (122); and operate the testing module (335) to measure the analogue output of the dummy load (240) to determine a measure of linearity of the digital to analogue converter (122).

20 Claims, 5 Drawing Sheets

(56) References Cited

U.S. PATENT DOCUMENTS

| | | |
|---|---|---|
| 7,679,538 B2 | 3/2010 | Tsang |
| 10,230,378 B2 | 3/2019 | Thuries et al. |
| 10,418,972 B2 | 9/2019 | Thuries et al. |
| 2009/0224961 A1 | 9/2009 | Inatsune |
| 2017/0090014 A1* | 3/2017 | Subburaj ............... G01S 13/931 |
| 2017/0090015 A1* | 3/2017 | Breen .................... G01S 7/032 |

* cited by examiner

RADAR TRANSCEIVER

CROSS-REFERENCE TO RELATED APPLICATIONS

This application claims the priority under 35 U.S.C. § 119 of European Patent application no. 20305932.4, filed on 14 Aug. 2020, the contents of which are incorporated by reference herein.

FIELD

The disclosure relates to a radar transceiver having a transmitter comprising a phase shifter.

BACKGROUND

Phase rotators or phase shifter (PS) circuits are often used in communication systems, and more specifically in transceivers. Particularly in radar systems, a phase shifter may be placed in the transmitter path, allowing beam forming, which increases radar resolution.

SUMMARY

According to a first aspect there is provided a radar transceiver having a normal mode of transmitter operation and a self-test mode of operation, the transceiver comprising:
  a digital controller configured to provide a digital control signal indicative of a phase shift;
  a digital to analogue converter configured to receive the digital control signal and provide an analogue signal in accordance with the phase shift;
  a phase shifter configured to receive the analogue signal and provide a phase shifted output signal for transmission;
  a dummy load connected to receive the analogue signal from the digital to analogue converter and to provide an analogue output;
  a resistor network connected across an output of the dummy load;
  a testing module configured to measure the analogue output of the dummy load; and
  a controller module configured to control operation of the dummy load, testing module and digital controller during the self-test mode of operation by:
  enabling the dummy load;
  operating the digital controller to provide a range of digital control signals to the digital to analogue converter; and
  operate the testing module to measure the analogue output of the dummy load to determine a measure of linearity of the digital to analogue converter.

The dummy load may be a duplicate of the phase shifter.

The controller module may be configured to operate the testing module to provide a current through the resistor network and to measure a resistance value of the resistor network prior to operating the digital controller.

The controller module may be configured to disable the dummy load during the normal mode of transmitter operation.

The dummy load may comprise first and second differential output connections, and the resistor network may comprise:
  a first resistor connected between the first differential output connection and a common node;
  a second resistor connected between the common node and the second differential output connection.

The testing module may be configured to measure a voltage between any two of the first and second differential output connections and the common node.

The first and second resistors may be variable resistors.

During a production self-test mode, the controller module may be configured to output and store a first digital code representing the measure of linearity of the digital to analogue converter.

During a service self-test mode, the controller module may be configured to output a second digital code representing the measure of linearity of the digital to analogue converter and to compare the second digital code with the stored first digital code.

The transceiver may be configured to operate in the normal mode of operation if the first and second output digital codes match.

If the first and second output digital codes do not match the transceiver may be configured to operate in a fail-safe mode, the controller may output an error flag, and/or the controller may disable operation of the transceiver.

If the dummy load is termed a first dummy load and the resistor network a first resistor network, the transceiver may further comprise a second dummy load connected to receive the analogue signal and output a baseband signal to a receiver module of the transceiver.

According to a second aspect there is provided a method of testing a radar transceiver according to the first aspect, the method comprising the controller module:
  enabling the transceiver;
  operating the digital controller to provide a digital control signal to the digital to analogue converter;
  operating the testing module to measure the output of the dummy load and providing a digital code as a measure of linearity of the digital to analogue converter.

According to a third aspect there is provided a computer program comprising instructions to cause a computer processor, i.e. the controller module, to perform the method according to the second aspect.

There may be provided a computer program, which when run on a computer, causes the computer to configure any apparatus, including a circuit, controller, sensor, filter, or device disclosed herein or perform any method disclosed herein. The computer program may be a software implementation, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software implementation may be an assembly program.

The computer program may be provided on a non-transitory computer readable medium, which may be a physical computer readable medium, such as a disc or a memory device, or may be embodied as a transient signal. Such a transient signal may be a network download, including an internet download.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which.

Figure 1:
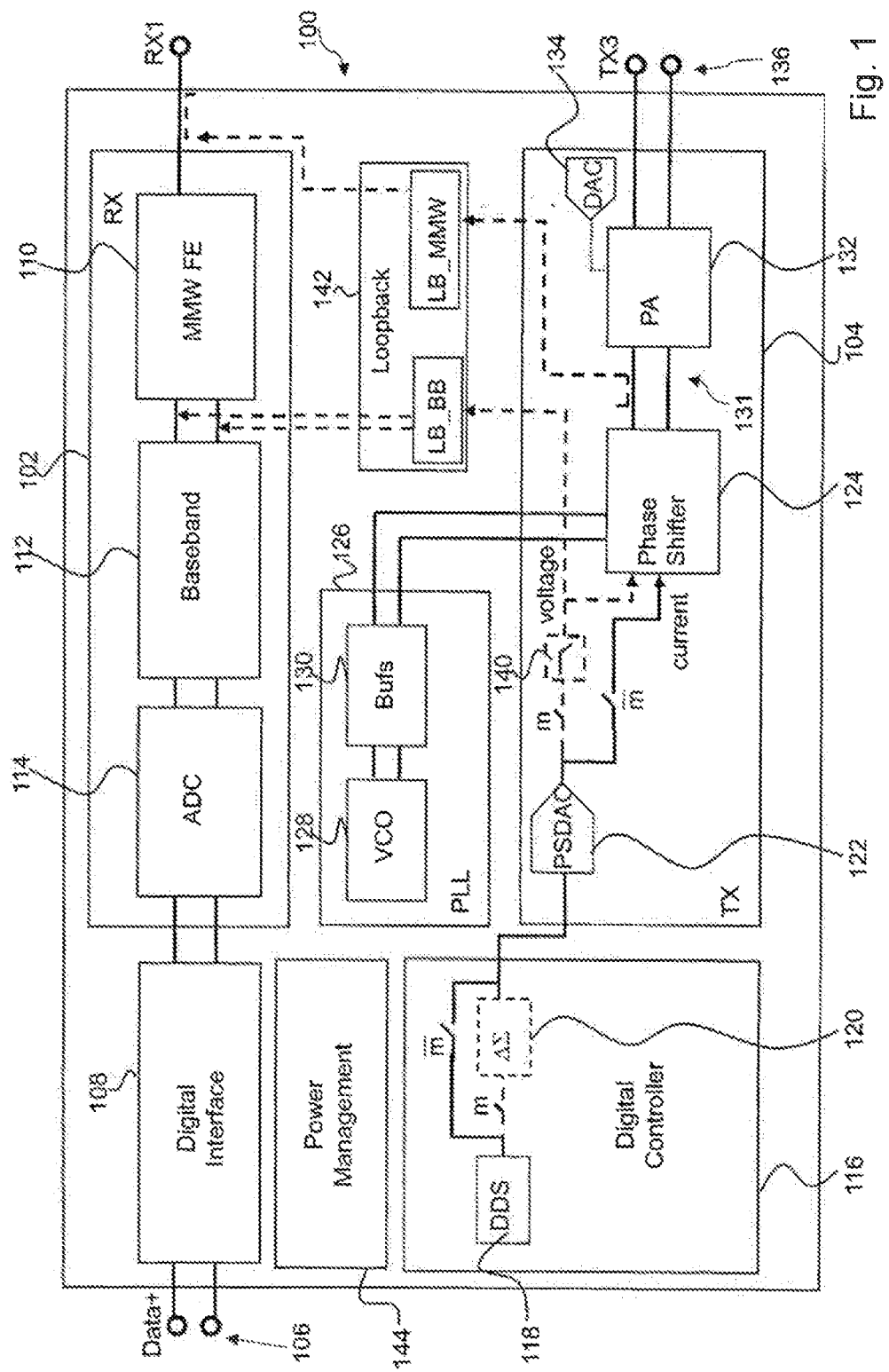
FIG. 1 is a schematic block diagram of an example radar transceiver.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments.

DETAILED DESCRIPTION OF EMBODIMENTS

FIG. 1 illustrates a simplified block diagram of an example radar device 100, as disclosed in U.S. Pat. No. 10,418,972 B2. The radar device 100 comprises a radar transceiver with a receiver module 102 and a transmitter module 104. A data output 106 can be retrieved from the receiver module 102 via a digital interface 108. The receiver module 102 may comprise, for example, a millimetre wave front end (MMW FE) 110 coupled to a receiver input RX1 and configured to provide a signal to a baseband module 112, composed of variable gain amplifiers and filters. Signals passed by the baseband module 112 may be converted from the analogue domain to the digital domain by an analogue-to-digital convertor (ADC) 114 to provide a digital output of the receiver module 102. The digital output of the receiver module 102 may be exported from the radar device 100 via the digital interface 108. The digital interface 108 may comprise buffers and data format convertors, for example.

The transmitter 104 is connected to a digital controller 116. The digital controller 116 comprises a direct digital synthesiser (DDS) 118. The output of the DDS 118 is provided by the digital controller 116 to the transmitter module 104. The signal from the DDS 118 may be provided at the output of the digital controller 116 via a sigma-delta modulator 120.

The phase of the signal for transmission is generated by a phase shifter digital-to-analogue convertor (PSDAC) 122 of the transmitter module 104 under the control of the DDS 118 of the digital controller 116. The PSDAC 122 drives a phase shifter 124. The phase shifter 124 also receives an oscillator signal from a phase lock loop (PLL) circuit 126.

The phase lock loop circuit 126 comprises a voltage-controlled oscillator (VCO) 128 and buffers 130. The phase shifter 124 provides a phase shifted signal 131 to a power amplifier (PA) 132. The PA 132 also receives the output of a digital-to-analogue convertor (DAC) 134. The DAC 134 provides for control of output power of the PA 132 in current mode. The PA 132 provides a transmission signal 136 to a transmitter output TX3 for providing to an antenna.

Phase control of the transmitter module 104 and digital controller 116 may be operable in either a voltage mode or a current mode in the example shown in FIG. 1. The mode of the transmitter module 104 may be controlled in accordance with a state of the radar device 100 via the digital controller 116. For example, in a normal mode of operation phase control of the transmitter module 104 may operate in current mode. In a built-in self-test (BIST) mode of operation. The receiver module 102 may be driven in voltage mode. The voltage mode of operation of the phase shifter 124 of the transmitter module 104 may provide higher accuracy than the current mode, which is useful for testing the linearity of the receiver chain during a BIST procedure, an example of which is provided below. By driving the phase shifter 124 in a current mode during the normal mode of operation, the transmitter power noise of the transmitter module 104 in normal operation may be reduced compared to the use of voltage mode driven phase shifters.

In the voltage mode of operation, the output of the DDS 118 may be provided to the input of the phase shifter DAC via the sigma-delta modulator 120. The output of the phase shifter DAC 122 in the voltage mode is provided to the phase shifter 124 via a low pass filter 140 to remove out-of-band signals. The use of a sigma-delta (SD) modulator to drive the PSDAC 122 may increase the phase accuracy of the transmitted signals by increasing the effective number of bits of the PSDAC 122. In this way, the complexity of the PSDAC that is required can be reduced while still providing acceptable performance.

The output of the low pass filter 140 in the voltage mode is also provided by a loop back module 142 to the input of the baseband 112 of the receiver module 102 as part of the BIST procedure. In voltage mode, the output of the phase shifter 124 is also provided at the input of the millimetre wave front end 110 of the receiver module 102 via the loop back module 142. During the normal mode of operation, when the phase shifter 124 is current driven, the output of the DDS 118 is provided directly to the input of the phase shifter DAC 122, and the output of the phase shifter DAC 122 is provided directly as an input to the phase shifter 124. The loop back module 142 is for use in the BIST procedure and so is not required in the current mode of operation.

In this way, according to the selected mode (voltage or current), parts of the circuit are activated or deactivated to provide the best trade-off between signal phase accuracy and transmitted noise power. The ability to drive the phase shifter 124 in either voltage or current mode is combined within a single phase shifter architecture in order to provide both a good signal (high SNR) for testing purpose and a low transmitter noise power during normal transmitter operation.

The radar device 100 also comprises a power management module 144, which may operate in a conventional fashion. The radar device 100, or part thereof, may be implemented using CMOS technology.

Figure 2:
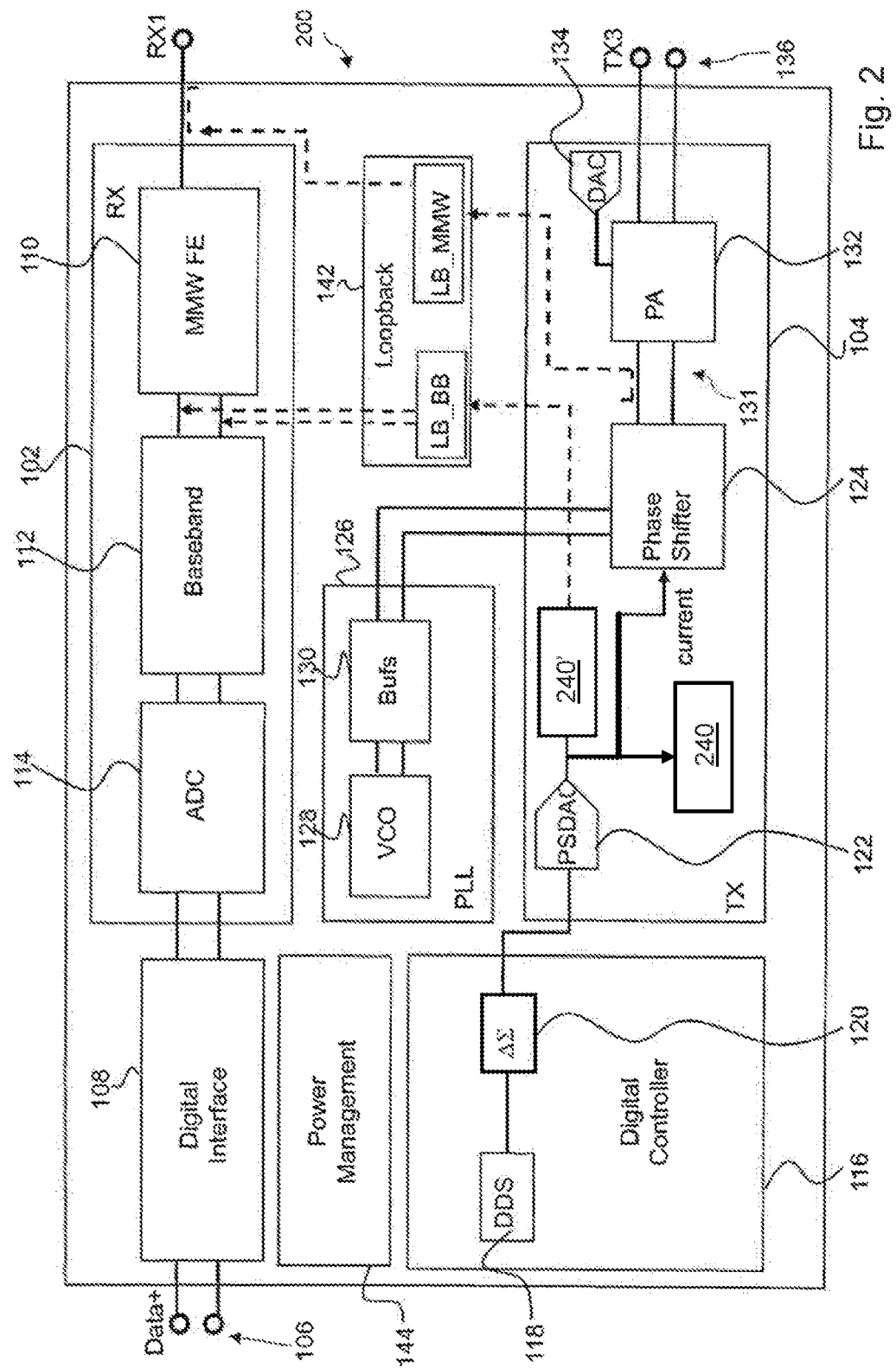
FIG. 2 is a schematic block diagram of an example radar transceiver with a dummy load.

FIG. 2 illustrates a simplified block diagram of an example radar device 200. In place of, or in some cases in addition to, the low-pass filter 140 of the device 100 in FIG. 1, a dummy load 240 is provided that is connected to the PSDAC 122 output. The dummy load 240 may also be connected to a baseband portion of the loop back module 142. The dummy load 140 may be used for a BIST sequence during operational mode and may also be enabled during production testing. The dummy load 240, or another dummy load 240', can also be used to loop back an IF signal for a BIST of the baseband 112 of the receiver module 102.

Figure 3:
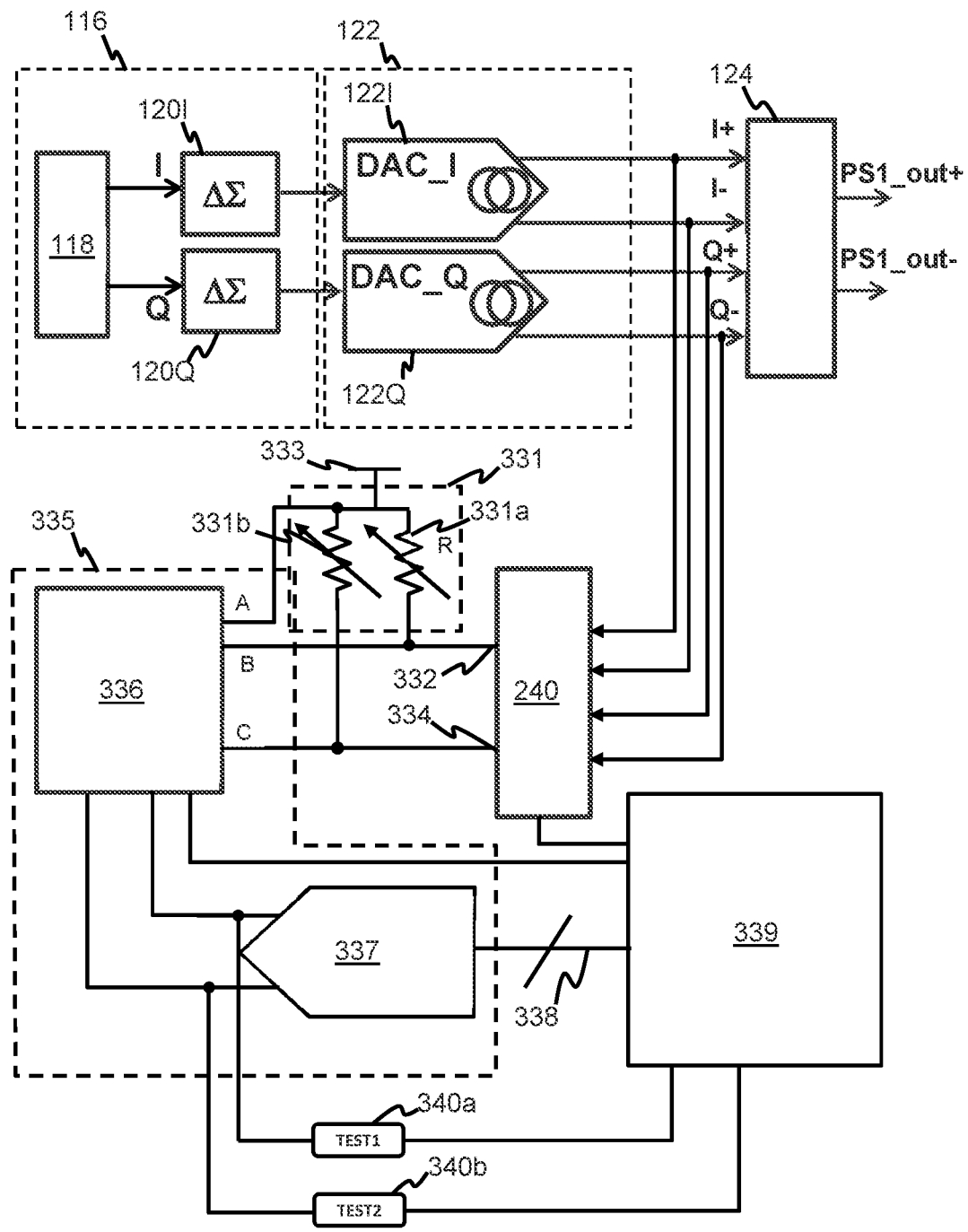
FIG. 3 is a schematic block diagram of a part of the example radar transceiver of FIG. 2 together with associated components.

FIG. 3 illustrates a more detailed view of some of the components of the transceiver 200 of FIG. 2. The digital controller 116 comprises the DDS 118 and a delta-sigma converter 120I, 120Q for the in-phase and quadrature components of the DDS outputs 1, Q. Outputs of the delta-sigma converters 120I, 120Q are provided to the PSDAC 122, having first and second paths comprising DACs 122I and 122Q. Differential output signals are provided to the phase shifter 124, which provides a differential output PS1_out+, PS1_out− to the power amplifier 132, as shown in FIG. 2.

Signals from each of the inputs to the phase shifter 124 are also provided to a dummy load module 240. The dummy load module 240 is preferably a duplicate of the phase shifter 124, i.e. having the same arrangement of components to provide an equivalent load from the perspective of the PSDAC 122. As with the phase shifter 124, the dummy load 240 provides a differential output, but this is connected across a resistor network 331. The resistor network 331 comprises a first resistor 331a connected between a first differential output connection 332 and a common node 333 and a second resistor 331b connected between the common node 333 and a second differential output connection 334 of the dummy load 240.

A testing module 335 is connected to the resistor network 331 and the outputs 332, 334 of the dummy load 240 and comprises an analogue testing bus (ATB) 336 and analogue to digital converter (ADC) 337 for converting an output of the ATB to a digital output signal 338.

A controller module 339 is configured to control operation of the ATB 336 and dummy load 240. The controller module 339 is also configured to control operation of the digital controller 116 during a self-test mode of operation either during a production self-test or an in-service BIST mode of operation.

During a self-test mode of operation or in production, the controller module 339 may first generate a known test signal in the form of a set current to be provided across the resistor network 331 via first and second test connections 340a, 340b connected to the ATB 336. The ATB 336, under control of the controller module 339, enables a selection to be made of which two of the three lines A, B and C are connected, enabling the test current to be passed via one or both of the resistors 331a, 331b of the resistor network. A measure of the voltage across the resistors can then be made to determine a measure of the values of the resistors 331a, 331b. The resistors 331a, 331b may be variable to provide a range of loads to the output of the dummy load 240. The values of the resistors 331a, 331b may be determined under control of the controller module 339, for example by controlling operation of an array of transistor switches in a resistor network forming each of the resistors 331a, 331b.

Assuming the values of the resistors 331a, 331b are known, or have been determined, in a self-test mode of operation the controller module 339 first enables the dummy load 240. The digital controller 116 is then operated by the controller module 339 to provide a range of digital control signals to the PSDAC 122, for example by providing signals ranging over the range of phase shifts expected to be employed in use. A determination can then be made as to the linearity of the PSDAC by taking measurements at each point in the range using the ATB 336 and ADC 337 to provide a digital output signal 338 to the controller module 339.

Figure 4:
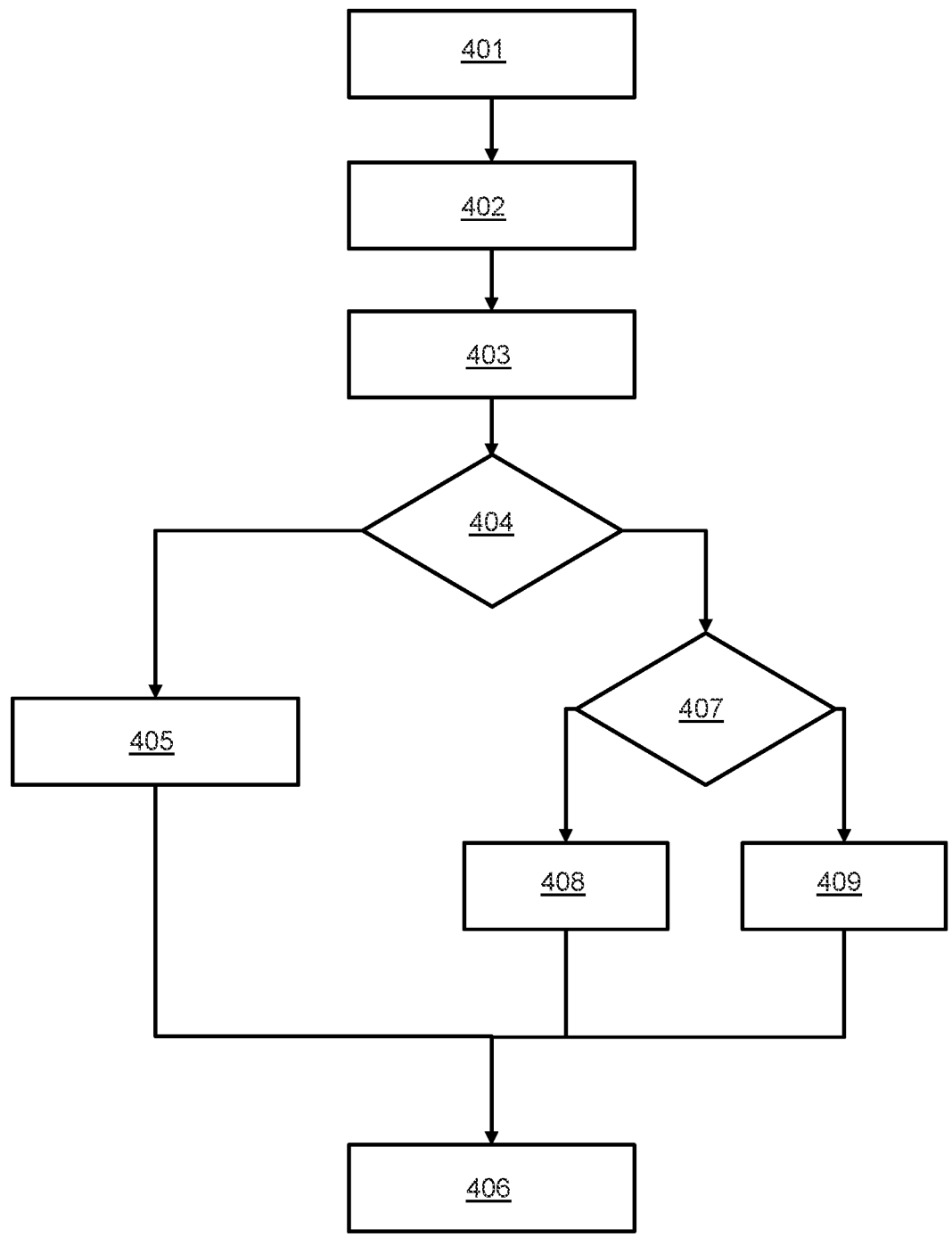
FIG. 4 is a schematic flow diagram illustrating example methods of performing self-test operations for the example transceiver.

An example method of operation during a self-test mode is illustrated in FIG. 4. In a first step 401, the dummy load 240 is enabled by the controller module 339. The digital controller 116, in step 402, is then operated by the controller module 339 to provide a range of digital control signals to the PSDAC 122. In step 403, which may be carried out simultaneously with step 402, the testing module 335 is operated by the controller module 339 to measure the output (i.e. the signals at nodes B and C in FIG. 3) to determine a measure of linearity of the PSDAC 122. The resulting series of digital signals may be either stored as a digital code (step 404 followed by 405) in the case of a production self-test operation before the method ends (step 406), or compared with a previously stored digital code (step 404 followed by step 407) in the case of a BIST operation while the transceiver is in service. If the comparison in step 407 results in the digital code being different from the previously stored digital code, the PSDAC is determined to be operating outside the production self-test linearity and the controller module 339 may then operate the transceiver in a fail-safe mode or generate an error flag, which may result in the transceiver being disabled (step 409). If the comparison results in the digital code being a match with the previously stored code, the controller module 339 may then allow the transceiver to operate in a normal mode (step 408).

Figure 5:
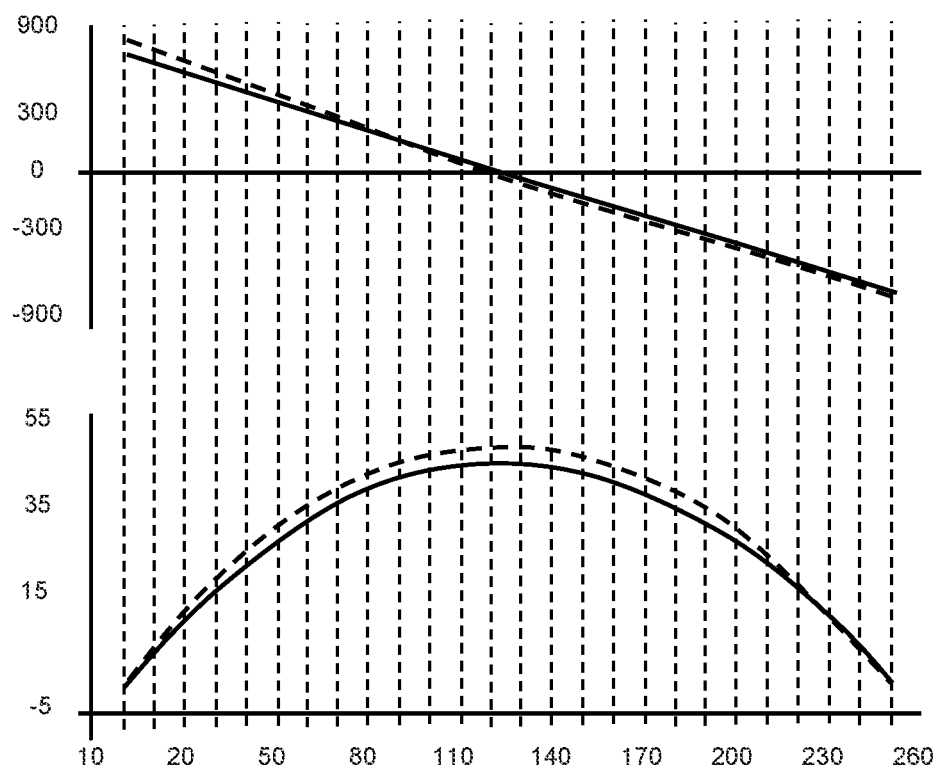
FIG. 5 illustrates simulation results for differential (top plot) and integral (bottom plot) linearity for the I output of a PSDAC with and without a dummy load.

Simulations demonstrate that by using a dummy load in the way outlined herein, the I and Q outputs from PSDAC 122 to the phase shifter 124 are essentially unchanged when the dummy load path is included and with the dummy load enabled, i.e. in a self-test mode of operation, or disabled in a normal mode of operation. The integrated and differential linearity of the I and Q outputs are also substantially unaffected by the presence of the dummy load, whether enabled or disabled, thereby allowing the dummy load 240 to provide a representative load to allow the linearity of the PSDAC 122 to be measured. As an example, FIG. 5 illustrates simulation results for differential (top) and integral (bottom) linearity for the I output of the PSDAC with and without the dummy load. The dotted lines indicate the results with the load, and the solid lines without the load. Results from the Q output, which are not shown, are similar. The difference between the results is sufficiently small that the dummy load can be used to measure the linearity of the PSDAC without significantly affecting its operation, enabling an accurate measure of linearity during normal use to be determined.

From reading the present disclosure, other variations and modifications will be apparent to the skilled person. Such variations and modifications may involve equivalent and other features which are already known in the art of memory systems, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single

The invention claimed is:

1. A radar transceiver having a normal mode of transmitter operation and a self-test mode of operation, the transceiver comprising:
   a digital controller configured to provide a digital control signal indicative of a phase shift;
   a digital to analogue converter configured to receive the digital control signal and provide an analogue signal in accordance with the phase shift;
   a phase shifter configured to receive the analogue signal and provide a phase shifted output signal for transmission;
   a dummy load connected to receive the analogue signal from the digital to analogue converter and to provide an analogue output;
   a resistor network connected across an output of the dummy load;
   a testing module configured to measure the analogue output of the dummy load; and
   a controller module configured to control operation of the dummy load, testing module and digital controller during the self-test mode of operation by:
   enabling the dummy load;
   operating the digital controller to provide a range of digital control signals to the digital to analogue converter; and
   operating the testing module to measure the analogue output of the dummy load to determine a measure of linearity of the digital to analogue converter.

2. The transceiver of claim 1, wherein the dummy load is a duplicate of the phase shifter.

3. The transceiver of claim 1, wherein the controller module is configured to operate the testing module to provide a current through the resistor network and to measure a resistance value of the resistor network prior to operating the digital controller.

4. The transceiver of claim 1, wherein the controller module is configured to disable the dummy load during the normal mode of transmitter operation.

5. The transceiver of claim 1, wherein the dummy load comprises first and second differential output connections, the resistor network comprising:
   a first resistor connected between the first differential output connection and a common node;
   a second resistor (331b) connected between the common node and the second differential output connection.

6. The transceiver of claim 5, wherein the testing module is configured to measure a voltage between any two of the first and second differential output connections and the common node.

7. The transceiver of claim 5, wherein the first and second resistors are variable resistors.

8. The transceiver of claim 1 wherein, during a production self-test mode, the controller module is configured to output and store a first digital code representing the measure of linearity of the digital to analogue converter.

9. The transceiver of claim 8 wherein, during a service self-test mode, the controller module is configured to output a second digital code representing the measure of linearity of the digital to analogue converter and to compare the second digital code with the stored first digital code.

10. The transceiver of claim 9 wherein the transceiver is configured to operate in the normal mode of operation if the first and second output digital codes match.

11. The transceiver of claim 9 wherein the transceiver is configured to operate in a fail-safe mode if the first and second output digital codes do not match.

12. The transceiver of claim 9 wherein the controller module is configured to output an error flag and/or disable operation of the transceiver if the first and second digital codes do not match.

13. The transceiver of claim 1, wherein the dummy load is a first dummy load and the resistor network is a first resistor network, the transceiver comprising a second dummy load connected to receive the analogue signal and output a baseband signal to a receiver module of the transceiver.

14. A method of testing a radar transceiver according to claim 1, the method comprising the controller module:
   enabling the transceiver;
   operating the digital controller to provide a digital control signal to the digital to analogue converter;
   operating the testing module to measure the output of the dummy load and providing a digital code as a measure of linearity of the digital to analogue converter.

15. A computer program comprising instructions for causing a controller module to perform the method according to claim 14.

16. A method of operating a radar transceiver having a normal mode of transmitter operation and a self-test mode of operation, the method comprising:
   generating, by way of a digital controller, a digital control signal indicative of a phase shift;
   generating, by way of a digital to analogue converter, an analogue signal in accordance with the phase shift;
   receiving the analogue signal at a phase shifter, the phase shifter generating a phase shifted output signal for transmission based on the analogue signal;
   receiving the analogue signal at a dummy load module, the dummy load module generating an analogue output based the analogue signal;
   measuring, by way of a testing module, the analogue output of the dummy load module; and
   during the self-test mode of operation:
      enabling the dummy load;
      operating the digital controller to provide a range of digital control signals to the digital to analogue converter; and
      operating the testing module to measure the analogue output of the dummy load module to determine a measure of linearity of the digital to analogue converter.

17. The method of claim 16, wherein the dummy load module is configured to provide a load equivalent to that of the phase shifter.

18. The method of claim 16, further comprising disabling the dummy load during the normal mode of transmitter operation.

19. The method of claim 16, wherein the dummy load module comprises first and second differential output connections.

20. The method of claim 19, wherein measuring, by way of the testing module, further comprises measuring a voltage between any two of the first and second differential output connections and a common node, the common node coupled to the first and second differential output connections by way of a resistor network.

* * * * *